(12) United States Patent
Lippincott et al.

(10) Patent No.: US 8,250,495 B2
(45) Date of Patent: Aug. 21, 2012

(54) MASK DECOMPOSITION FOR DOUBLE DIPOLE LITHOGRAPHY

(75) Inventors: George P. Lippincott, Lake Oswego, OR (US); Sergly M. Komirenko, Cupertino, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 101 days.

(21) Appl. No.: 12/689,972

(22) Filed: Jan. 19, 2010

(65) Prior Publication Data
US 2010/0223590 A1 Sep. 2, 2010

Related U.S. Application Data

(60) Provisional application No. 61/145,483, filed on Jan. 16, 2009, provisional application No. 61/145,741, filed on Jan. 19, 2009.

(51) Int. Cl.
*G06F 17/50* (2006.01)

(52) U.S. Cl. ........................................... 716/50

(58) Field of Classification Search .................. 716/100, 716/50
See application file for complete search history.

(56) References Cited

U.S. PATENT DOCUMENTS

| 8,108,806 B2 * | 1/2012 | Robles et al. | 716/53 |
| 2004/0005089 A1 * | 1/2004 | Robles et al. | 382/141 |
| 2008/0020296 A1 * | 1/2008 | Hsu et al. | 430/5 |
| 2008/0163153 A1 * | 7/2008 | Mukherjee et al. | 716/19 |
| 2010/0058263 A1 * | 3/2010 | Tyminski et al. | 716/5 |
| 2010/0167183 A1 * | 7/2010 | Hsu et al. | 430/5 |
| 2011/0023002 A1 * | 1/2011 | Cheng et al. | 716/126 |
| 2011/0083113 A1 * | 4/2011 | Ye et al. | 716/53 |
| 2011/0119648 A1 * | 5/2011 | Chen et al. | 716/126 |
| 2011/0296360 A1 * | 12/2011 | Wang et al. | 716/106 |
| 2012/0040280 A1 * | 2/2012 | Agarwal et al. | 430/30 |
| 2012/0047473 A1 * | 2/2012 | Reid et al. | 716/53 |

* cited by examiner

*Primary Examiner* — Suchin Parihar

(57) ABSTRACT

Method and apparatus for generating a pair of layouts suitable for forming exposure mask to use in a double dipole lithographic process are disclosed. With some implementations, a y-dipole layout and an x-dipole layout are generated by decomposing a target layout. Subsequently, an optical proximity correction process is implemented on the y-dipole layout and the x-dipole layout. The decomposition may designate ones of the edge segments in the target layout at major edge segments and other ones of the edge segments as minor edge segments. A higher feedback value may then be assigned to the minor edges than the major edges. Subsequently, a few iterations of an optical proximity correction process that utilizes a smaller than intended mask rule constraint value and the assigned feedback values is implemented on the target layout. The minor edges separated by a distance of less than the intended mask rule constraint distance are then collapsed. After which, a few iterations of the optical proximity correction process are allowed to iterate. In further implementations, once the y-dipole and x-dipole layouts have been generated. An additional optical proximity correction process is implemented on the layouts. During this optical proximity correction process, a higher feedback values is again assigned to the minor edge segments. At a point during the optical proximity correction process, minor edges within portions of the layouts that have a bias value larger than a predetermined value are expanded back from their collapsed position.

18 Claims, 13 Drawing Sheets

MASK DECOMPOSITION FOR DOUBLE DIPOLE LITHOGRAPHY

RELATED APPLICATIONS

This application claims priority under 35 U.S.C. §119(e) to U.S. Provisional Patent Application No. 61/145,483, entitled "Double Dipole Lithography for Optical Process Correction Decomposition," filed on Jan. 16, 2009, and naming George Lippincott et al. as inventors and to U.S. Provisional Patent Application No. 61/145,741, entitled "Double Dipole Lithography for Optical Process Correction Decomposition," filed on Jan. 19, 2009, and naming George Lippincott et al. as inventors, which applications are incorporated entirely herein by reference.

FIELD OF THE INVENTION

The invention relates to the field of integrated circuit design and manufacturing. More particularly, various implementations of the invention are applicable to double dipole lithography.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, a design may start at a high level of abstraction, by a designer creating a specification that describes particular desired functionality. This specification, typically implemented by a programming language, such as, C, C++, or SystemC for example, describes at a high level the desired behavior of the device. Designers will then often take this specification for the design and create a logical design, often implemented in a netlist, through a synthesis process.

The logical design, often implemented by a hardware description language ("HDL") such as Verilog, SystemVerilog, or Very High speed hardware description language ("VHDL"), describes the operation of the device by defining the flow of signals or the transfer of data between various hardware components within the design. For example, one type of logical design is a register transfer level design. A register transfer level design describes the interconnection and exchange of signals between hardware registers and the logical operations that are performed on those signals.

The logical design is subsequently transformed, this time into a gate level design. Gate level designs describe the actual physical components such as transistors, capacitors, and resistors as well as the interconnections between these physical components. Often, gate level designs are also implemented by a netlist, such as, for example, a mapped netlist. Lastly, the gate-level design is taken and another transformation is carried out. First by place and route tools that arrange the components described by the gate-level netlist and route connections between the arranged components; and second, by layout tools that generate a layout description having layout "shapes" that may then used to fabricate the electronic device, through for example, an optical lithographic process.

Integrated circuit layout descriptions can be provided in many different formats. The Graphic Data System II ("GDSII") format is popular for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard ("OASIS") proposed by Semiconductor Equipment and Materials International ("SEMI"). These various industry formats are used to define the geometrical information in integrated circuit layout designs that are employed to manufacture integrated circuits. Once the microcircuit device design is finalized, the layout portion of the design can be used by fabrication tools to manufacturer the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process. The image embodied in the layout data is often referred to as the intended image, the target image, or sometimes the target contours. Conversely, the image created in the mask is generally referred to as the mask contours. Furthermore, the image created on the substrate by employing the mask in a photolithographic process is often referred to as the printed image or the printed contours.

As designers and manufacturers continue to increase the number of circuit components in a given area and/or shrink the size of circuit components, the shapes reproduced on the substrate become smaller and are placed closer together. This reduction in feature size increases the difficulty of faithfully reproducing the image intended by the layout design onto the substrate. Various techniques exist for mitigating the difficult of faithfully reproducing the intended image. For example, optical process correction ("OPC") and other resolution enhancement techniques ("RET") are commonly employed to prepare a physical layout designs for manufacturing. Additionally, designers have begun to manipulate the light source of the optical lithographic process, as with double dipole lithography.

Double dipole lithography exposes the substrate twice, with two different light sources as opposed to a single light source exposure as with standard lithography. Typically, the light sources are off-axis illuminated and have different dipoles. That is, the light sources are "tilted" off center and one typically has dipoles located on the x-axes while the other has dipoles on the y-axes. Double dipole lithography provides for an increase in resolution of the intended image, as well as the depth of focus. However, due to the nature of double dipole lithography, one exposure provides good results with horizontal lines or "edges," while the other for vertical edges. However, as those of skill in the art can appreciate, intended images have both horizontal and vertical edges. Furthermore, intensity from one exposure tends to "bleed" onto the neighboring regions, which can degrade the image resulting from the first exposure.

SUMMARY OF THE INVENTION

Various implementations of the present invention provide for generating a pair of layouts suitable for forming exposure mask to use in a double dipole lithographic process. In various implementations, a y-dipole layout and an x-dipole layout are generated by decomposing a target layout. Subsequently, an optical proximity correction process is implemented on the y-dipole layout and the x-dipole layout.

With some implementations, the target layout is first decomposed into the y-dipole layout, and subsequently, the target layout is decomposed into the x-dipole layout. With further implementations, the decomposition designates ones of the edge segments in the target layout at major edge segments and other ones of the edge segments as minor edge segments. A higher feedback value is then assigned to the minor edges than the major edges. Subsequently, a few iterations of an optical proximity correction process, utilizing a smaller than intended mask rule constraint value, is implemented on the target layout. The minor edges separated by a distance of less than the intended mask rule constraint distance are then collapsed. After which, a few iterations of the optical proximity correction process are allowed to iterate.

In further implementations, once the y-dipole and x-dipole layouts have been generated. An additional optical proximity correction process is implemented on the layouts. During this optical proximity correction process, a higher feedback values is again assigned to the minor edge segments. At a point during the optical proximity correction process, minor edges within portions of the layouts that have a bias value larger than a predetermined value are expanded back from their collapsed position.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE IMPLEMENTATIONS

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "determine" to describe the disclosed methods. Such terms are often high-level abstractions of the actual operations that are performed. The actual operations that correspond to these terms will often vary depending on the particular implementation, and will be readily discernible by one of ordinary skill in the art.

The methods described herein will typically be implemented by software stored on a computer readable storage medium, or executed on a computer. Accordingly, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Figure 1:
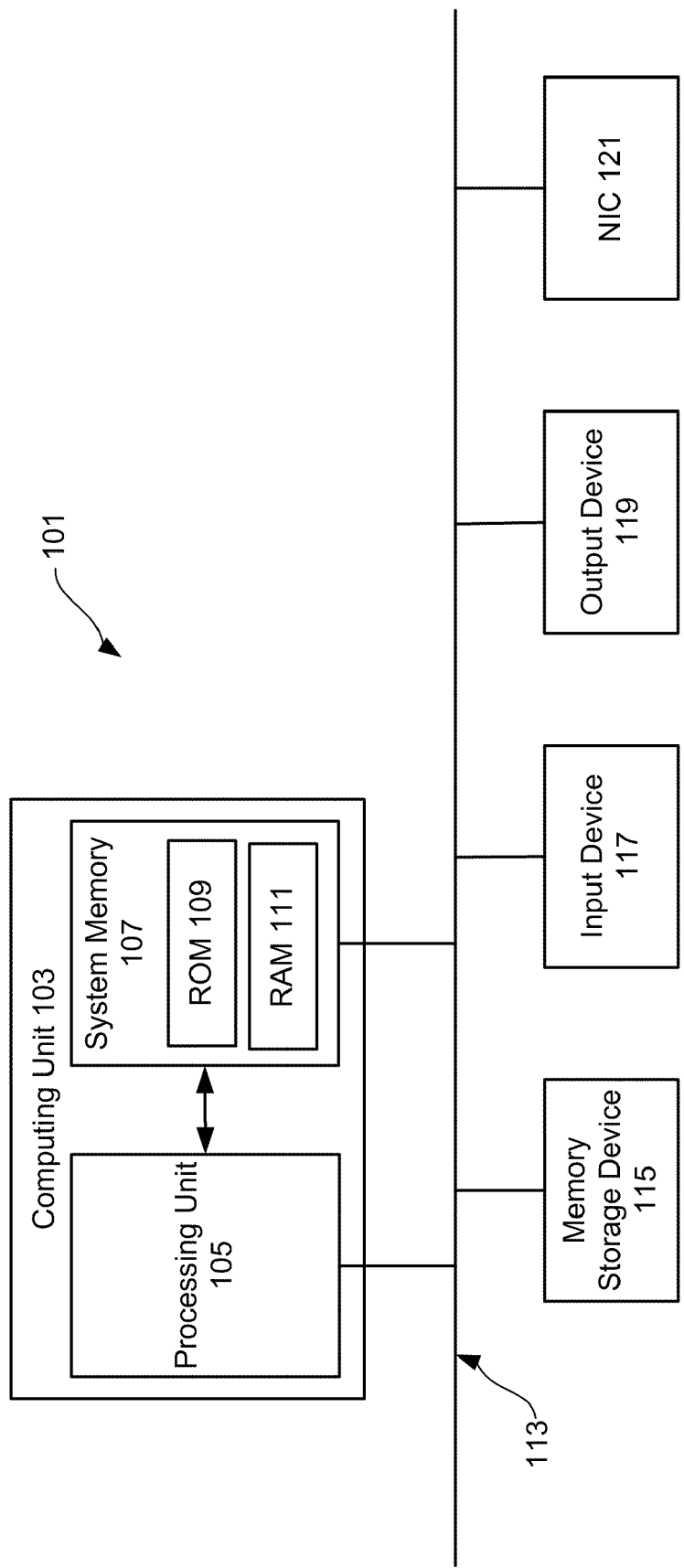
FIG. 1 shows an illustrative computing environment.

As the techniques of the present invention may be implemented using software instructions, the components and operation of a generic programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory ("ROM") 109 and a random access memory ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Illustrative Layout Design and Correction

In a lithographic process, as introduced above, electromagnetic radiation is transmitted through selectively transmissive areas of a mask. The radiation passing through these transmissive areas then irradiates desired portions of a photoresistive material on a layer of semiconductor substrate. The mask is created from layout design data describing the geometric features that should be manufactured in the semiconductor substrate, by way of the lithographic process. And as a result, forming the desired circuit in the substrate. For example, if a transistor should have a rectangular gate region, then the layout design data will include a rectangle defining that gate region. This rectangle in the layout design data is then implemented in a mask for transferring, often referred to as "printing," a rectangular image corresponding to the gate region onto the substrate.

Figure 2:
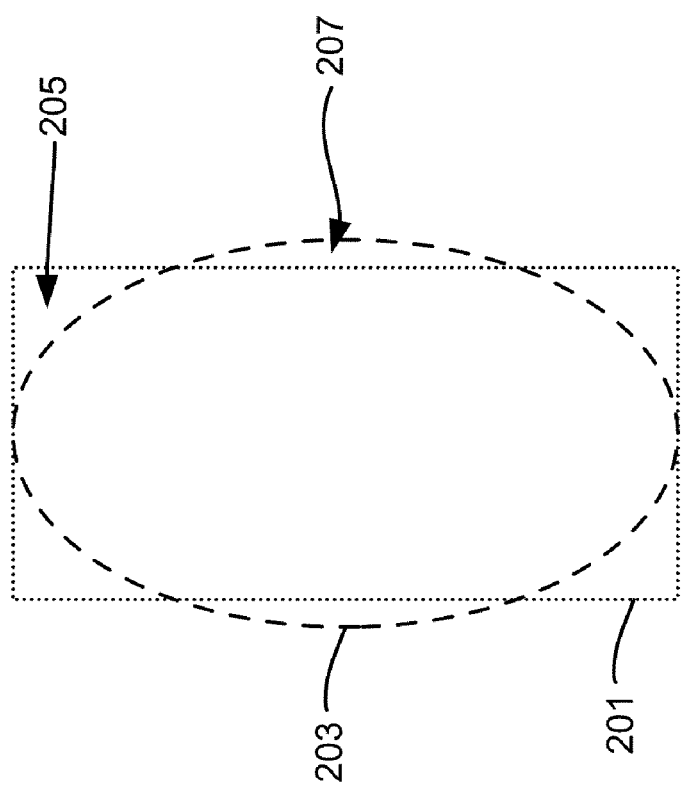
FIG. 2 illustrates a layout shape and corresponding printed shape.

During a lithographic process however, optical effects often prevent the shapes defined by the mask from being faithfully printed onto the substrate. Diffractive effects for example, may distort the image produced by a mask. Moreover, these distortions become more pronounced as the images produced by the mask become smaller relative to the wavelength of radiation used in the lithographic process. Thus, a lithographic process seeking to reproduce the rectangular mask feature 201 illustrated in FIG. 2, may only produce the image 203. As seen in this figure, the image 203 is substantially narrower in the corners (e.g., corner 205) than the ideal rectangular shape intended by the mask feature 201. Likewise, the image 203 may have areas (e.g., 207) that extend beyond the ideal rectangular shape intended by the mask feature 201. The shape or feature that is intended to be printed onto the substrate is often referred to as the target shape or the target image. The image created by employing the mask in a lithographic process, such as the image 203 for example, is often then referred to as the printed image.

Figure 3:
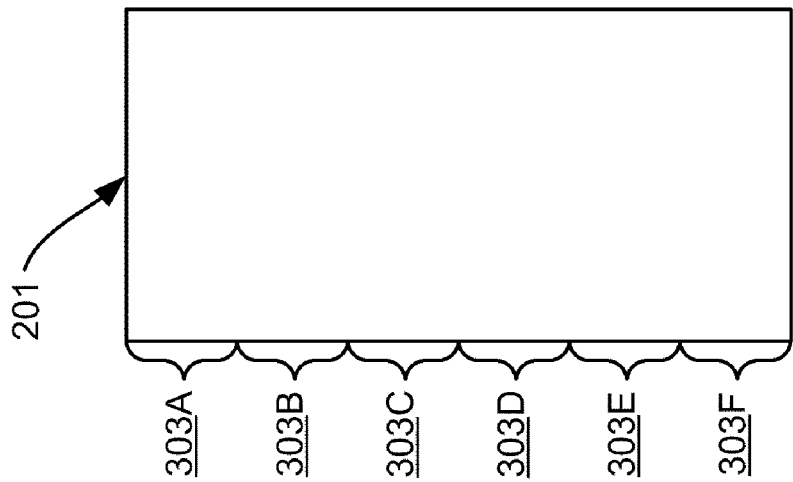
FIG. 3 illustrates the layout shape of FIG. 2.

To correct for these optical distortions, many circuit designers will attempt to enhance the fidelity with which the printed image corresponds to the intended image by modify the shapes comprising the mask. These techniques are often referred to as resolution enhancement techniques, as introduced above. Optical proximity correction ("OPC") is one such resolution enhancement technique. In a typical OPC process, the edges of the geometric elements in the design are fragmented and adjusted. For example, as shown in FIG. 3, an edge of the rectangular mask feature 201 is fragmented into edge segments 303A-303F. The partitioning of edge segments within a given layout design depends upon the specific optical proximity correction process parameters, often referred to as the optical proximity correction "recipe." The recipe specifies, among other factors, the size of the edge segments. Accordingly, not all edges within a layout design will be fragmented in every OPC process. Additionally, the size of the edge segments resulting from fragmenting the polygon edges within a layout design can vary depending upon the layout design, the OPC process, or the optical proximity correction recipe.

Figure 4B:
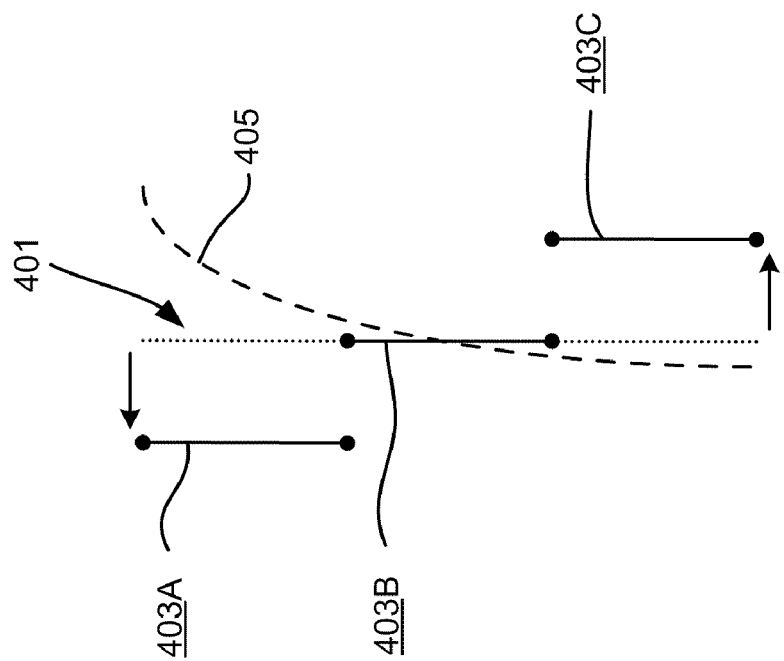
FIG. 4B illustrates the portion of the layout shape of FIG. 4A, having its edge segments displaced.
Figure 4A:
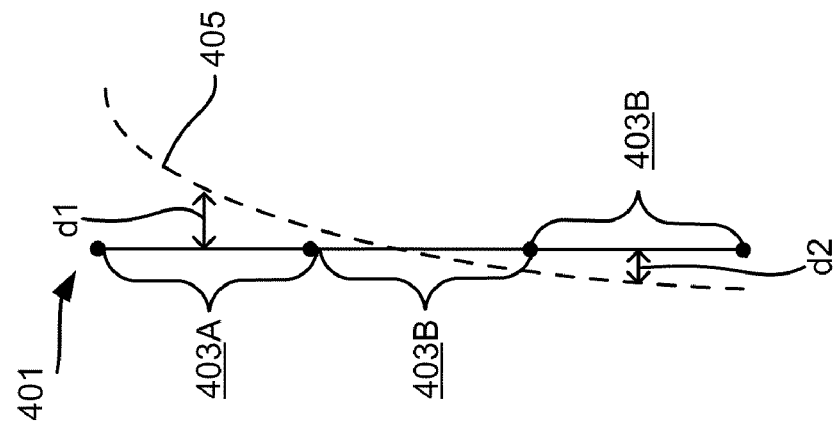
FIG. 4A illustrates a portion of a layout shape and corresponding simulated printed image.

In attempting to correct for optical distortions within the lithographic process, the OPC process simulates the printed image. That is, the lithographic process is simulated in order to produce a simulated printed image. FIG. 4A illustrates a portion of a target image 401, edge segments 403 of a portion of a mask feature corresponding to the portion of the target image 401, and a simulated printed image 405 corresponding to the mask feature. In the optical proximity correction process, the simulated image 405 is compared to the target image 401. Typically, this comparison is done at each edge segment 403. For example, as shown in FIG. 4, the target image 401 is a distance d1 away from the simulated printed image 405 at the edge segment 403A. The target image 401 is a distance d2 away from the simulated printed image 405 at the edge segment 403C, and the target image 401 intersects the simulated printed image 405 at the edge segment 403B. The distances between the target image 401 and the simulated printed image 405 are often referred to as the edge placement error ("EPE"). Accordingly, in a typical OPC process, each edge segment, as well as each un-fragmented edge, will have an associated EPE.

Following simulation and calculation of the EPE, the edge segments 403 are individually moved in order to improve the fidelity with which the simulated printed image 405 corresponds to the target image 401. For example, as shown in FIG. 4B, the edge segment 403A is displaced in a direction away from the target image 401, in an effort to widen the corresponding portion of the simulated printed image 405 at the location of the edge segment 403A. Similarly, the edge segment 403C is displaced in a direction away from the target image 401, in an effort to narrow the corresponding portion of an image that would be produced by the resulting mask at the location of the edge segment 403C. The amount of adjustment applied to each edge segment may vary depending upon the OPC process, or the optical proximity correction recipe.

In a typical OPC process, the adjustment of each edge segment is derived based in part upon the EPE and a movement bias value. Additionally, mask rule constraints are taken into account. A mask rule constraint ensures that the mask layout or mask shapes are actually manufacturable. For example, mask manufacturing tools are capable of manufacturing certain polygon shapes and have minimum dimensions corresponding to these manufacturable polygons. Accordingly, the mask layout must correspond to these minimum dimensions and these polygon shapes.

Figure 5B:
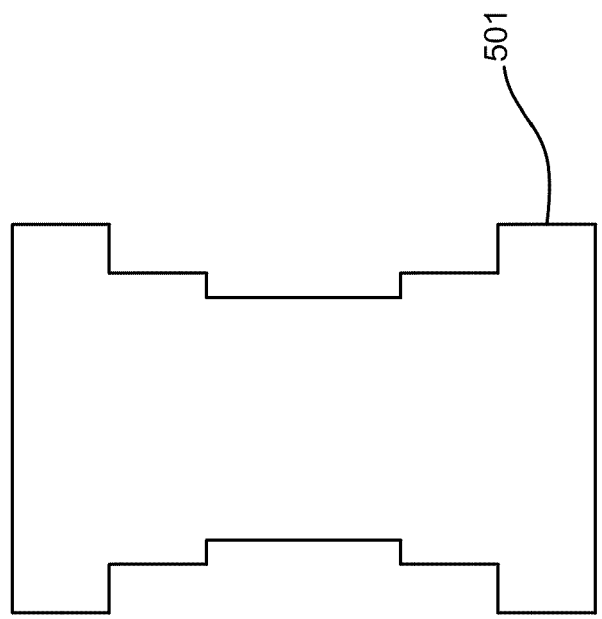
FIG. 5B illustrates a modified mask feature formed based upon the fragmented and adjusted mask feature of FIG. 5A.
Figure 5A:
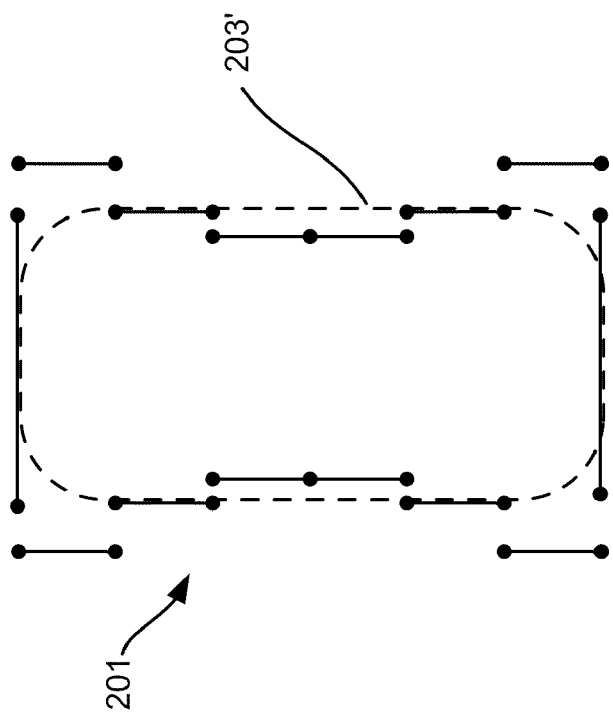
FIG. 5A illustrates a fragmented and adjusted mask feature.

This process of simulating the image that would be produced using the mask feature, comparing the simulated image to the target image, and moving edge segments accordingly may be repeated a number of times in a single OPC process. Each cycle of simulation, compare, and adjust is referred to as an iteration of the OPC process. In various implementations, the OPC process is allowed to iterate until the simulated image is sufficiently similar to the target image (e.g., both d1 and d2 are smaller than a threshold value), or until it is determined that the edge segments have converged on locations where no further movement of the edge segments will improve the simulated image. For example, FIG. 5A shows a fragmented and adjusted mask feature 201', which corresponds to the mask feature 201 of FIG. 2, having the edges fragmented and displaced. FIG. 5A additionally shows a simulated printed image 203' corresponding to the fragmented and adjusted mask feature 201'. Once the final positions of the edge segments are determined in the layout design data as shown in FIG. 5A, a modified mask feature can be created from the corrected layout design data. FIG. 5B shows a modified mask feature 501, produced from the fragmented and adjusted mask feature 201' of FIG. 5A.

Double Dipole Lithography

Figure 7:
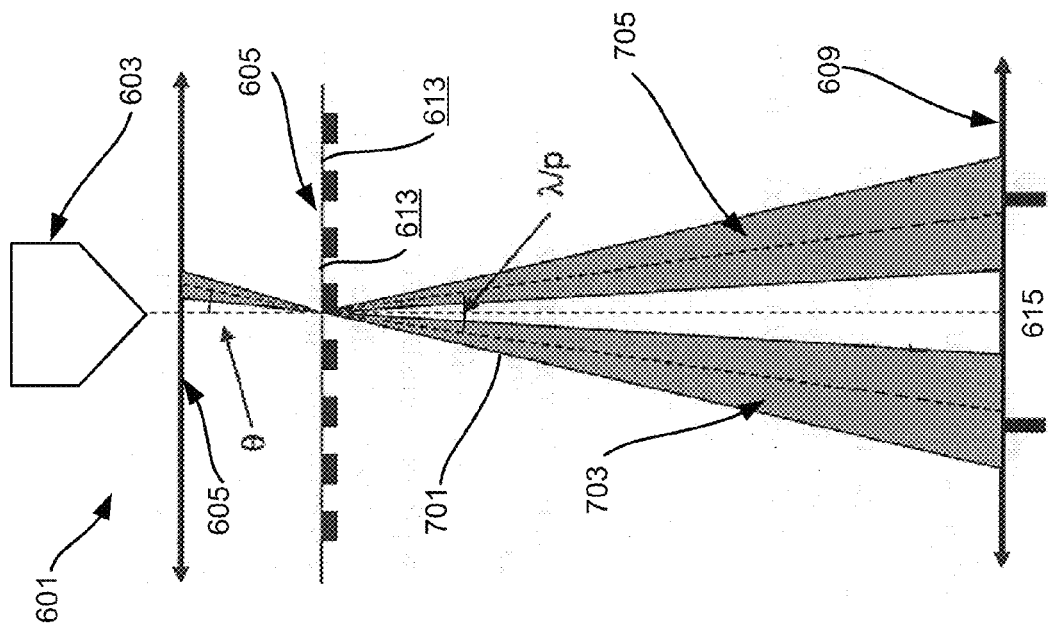
FIG. 7 illustrates the exposure apparatus of FIG. 6, highlighting off-axis illumination.
Figure 6:
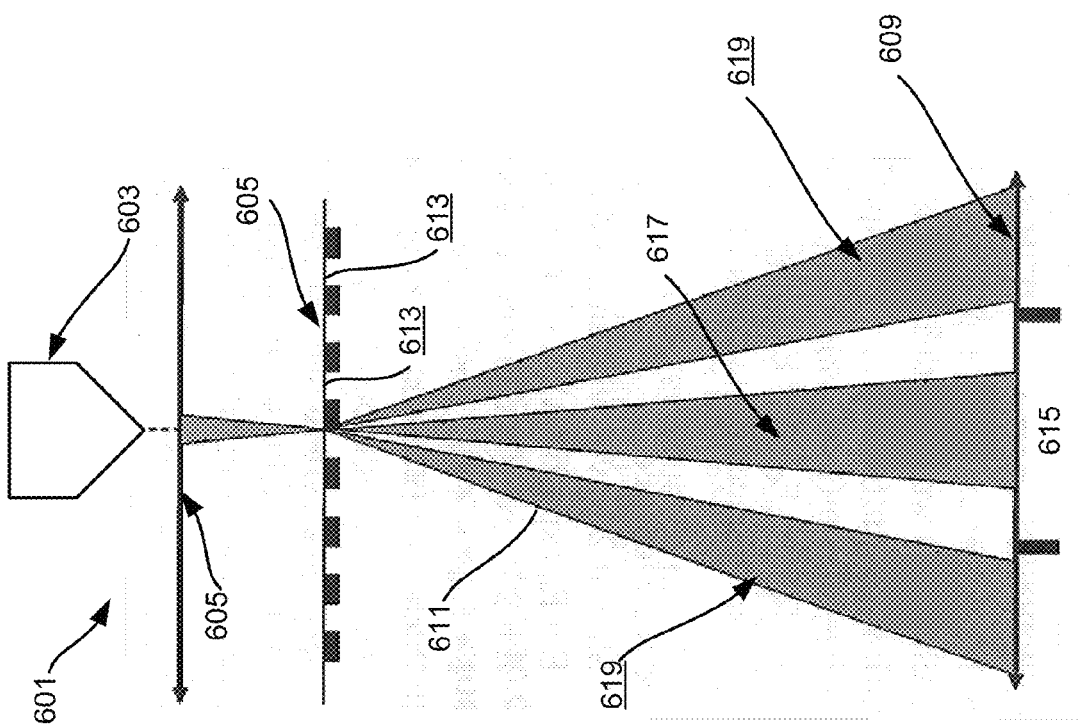
FIG. 6 illustrates an exposure apparatus, highlighting on-axis illumination.

As briefly introduced above, double dipole lithography ("DDL") uses "off-axis" illumination to increase resolution of the lithographic process. FIG. 6 shows an exposure apparatus 601 comprised of a light source 603, a condenser lens 605, a mask 607, and a projection lens 609. As can be seen from this figure, radiation 611 is emitted from the light source 603, which travels through transmissive areas 613 of the mask 607, and subsequently passes through the numerical aperture 615 of the projection lens 609. FIG. 6 illustrates "on-axis" illumination. That is, the radiation 611 is projected in such a manner that it is incident upon the mask in line with the center axis. As shown, this manner of exposure provides that the $0^{th}$ order of diffraction 617 passes through the numerical aperture 615, while the $1^{st}$ orders of diffraction 619 do not. FIG. 7, illustrates the principal of off-axis illumination. As can be seen from this figure, the exposure apparatus 601 of FIG. 6 is shown. However, the radiation 701 emitted from the light source 603 is tilted (i.e. θ) from the center axis. This tilting of the radiation 701, shifts the diffraction orders such that the $0^{th}$ order of diffraction 703 and the $1^{st}$ order of diffraction 705 pass through the numerical aperture 615.

Figure 8:
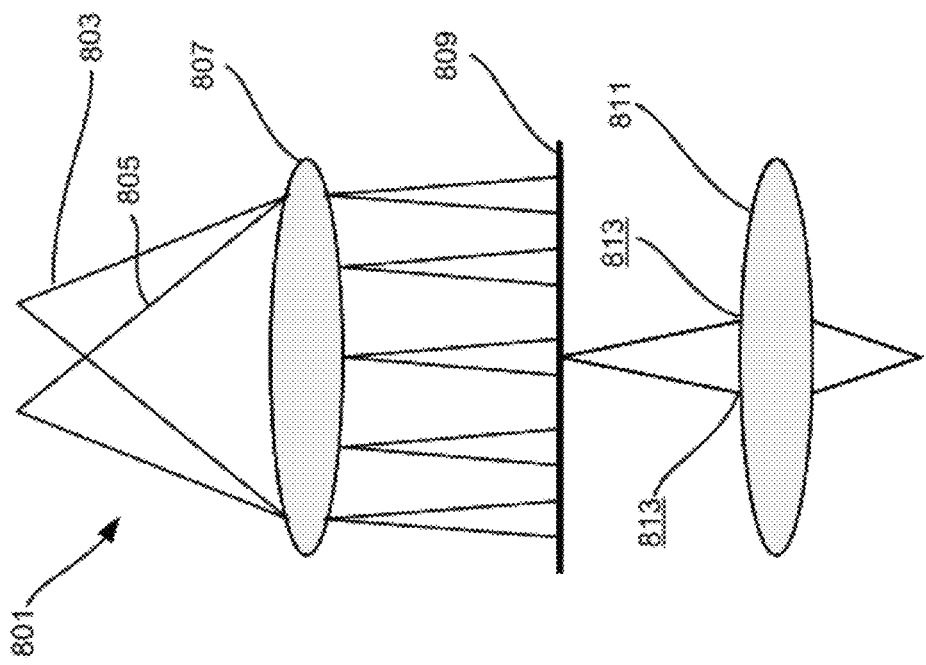
FIG. 8 illustrates dual light source exposure.

Double dipole lithography also uses two light sources. As a result, two dipoles are generated for each exposure. For example, FIG. 8 illustrates a dual light source exposure 801. As can be seen from this figure, radiation 803 from a first light source and radiation 805 from a second light source are shown. Additionally, a condenser lens 807, a mask 809, and a projection lens 811 are illustrated. As evidenced by this picture, the radiation 803 and the radiation 805 combine to form dipoles 813 on the projection lens 811.

Figure 9A:
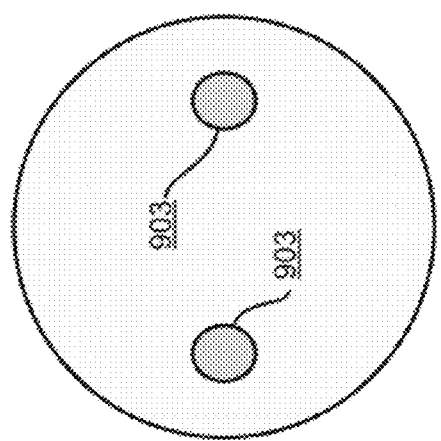
FIG. 9A illustrates horizontal dipoles.
Figure 9B:
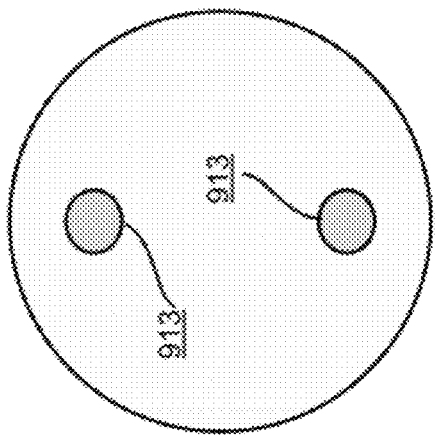
FIG. 9B illustrates vertical dipoles.

As stated above, DDL uses two exposures, both exposures creating a pair of dipoles, however, each exposure typically generates different types of dipoles. More particularly, FIG. 9A illustrates a projection lens 901 and a pair of horizontal or "x-dipoles" 903. FIG. 9B illustrates a projection lens 911 and a pair of vertical or "y-dipoles" 913. The x-dipole exposure prints vertical lines with better resolution than the y-dipole exposure does. Conversely, the y-dipole exposure prints horizontal lines with better resolution than the x-dipole exposure does. However, as can be appreciated, both exposures are necessary to accurately print an intended layout design. Furthermore, the intensity of radiation from one exposure often affects the results from the second exposure, making it difficult to simply assign horizontal edges to one exposure and vertical edges to the other exposure.

Double Dipole Lithography Decomposition

Figure 10:
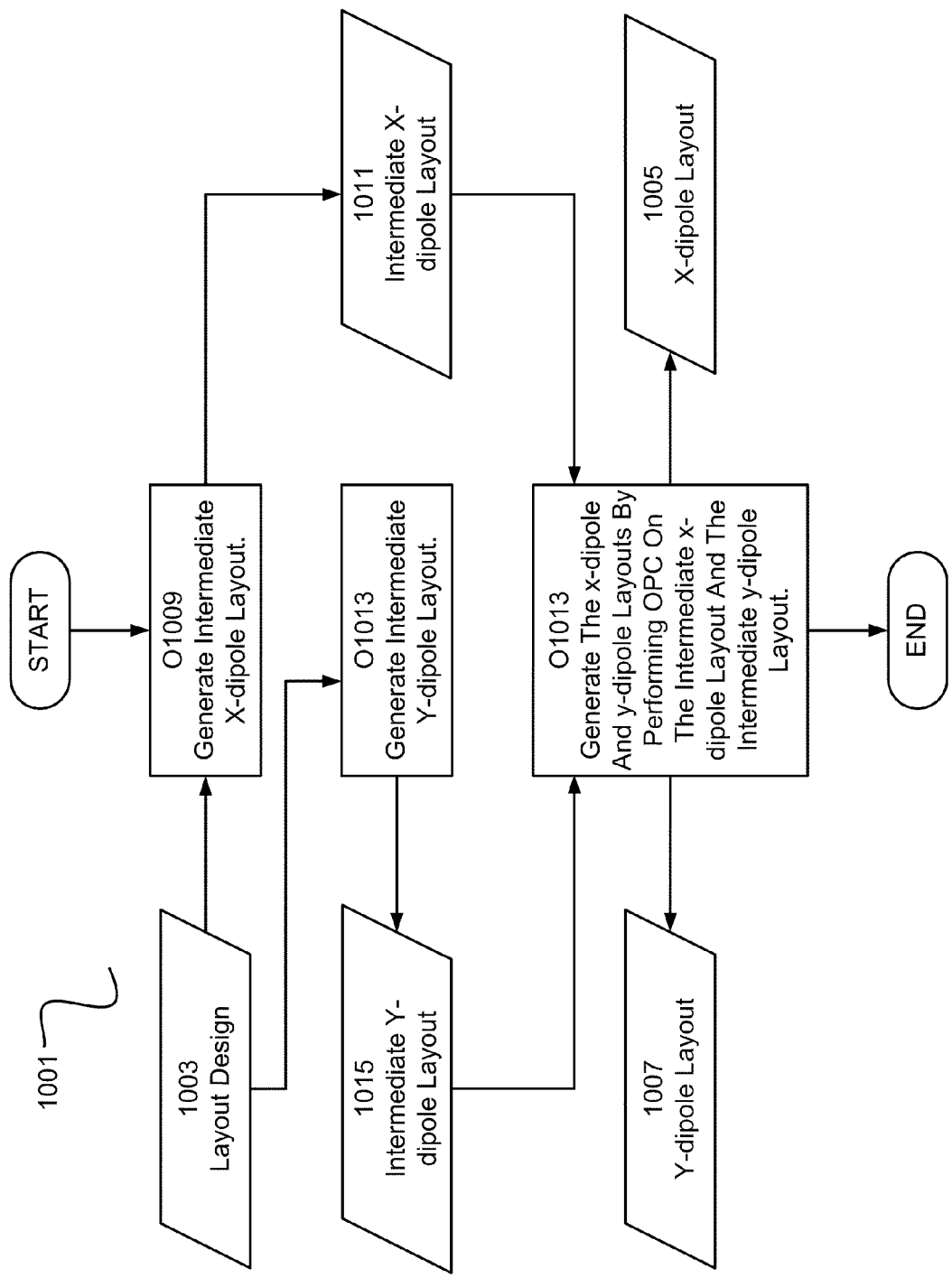
FIG. 10 illustrates a method of decomposing a layout design into x-dipole and y-dipole layouts.

FIG. 10 illustrates a method 1001 for decomposing a layout design 1003 into a x-dipole layout 1005 and a y-dipole layout 1007. In various implementations of the invention, the layout design 1003 is a layout design for a mask. With some implementations, the layout design 1003 is a target layout design. As can be seen from this figure, the method 1001 includes an operation 1009 for generating an intermediate x-dipole layout 1011 from the layout design 1003, an operation 1013 for generating an intermediate y-dipole layout 1015 from the layout design 1003, and an operation 1017 for generating the x-dipole layout 1005 and the y-dipole layout 1007 by performing optical proximity correction on the intermediate x-dipole layout 1011 and the intermediate y-dipole layout 1015.

As shown in FIG. 10, the operation 1013 generates a decomposed layout pair (i.e. the x-dipole layout 1005 and the y-dipole layout 1007) based in part upon application of an optical proximity correction process. As discussed in greater detail below, the intermediate layouts (i.e. the intermediate x-dipole layout 1011 and the intermediate y-dipole layout 1015) are modified during an optical proximity correction process, which results in the decomposed layout pair. In various implementations, as is clarified and explained in greater detailed below, the modification may change the initial decomposition, by, for example, collapsing edges or alternatively growing back collapsed edges on one or both of the layouts.

Decomposing the Target Layout into Intermediate Layouts

Figure 11:
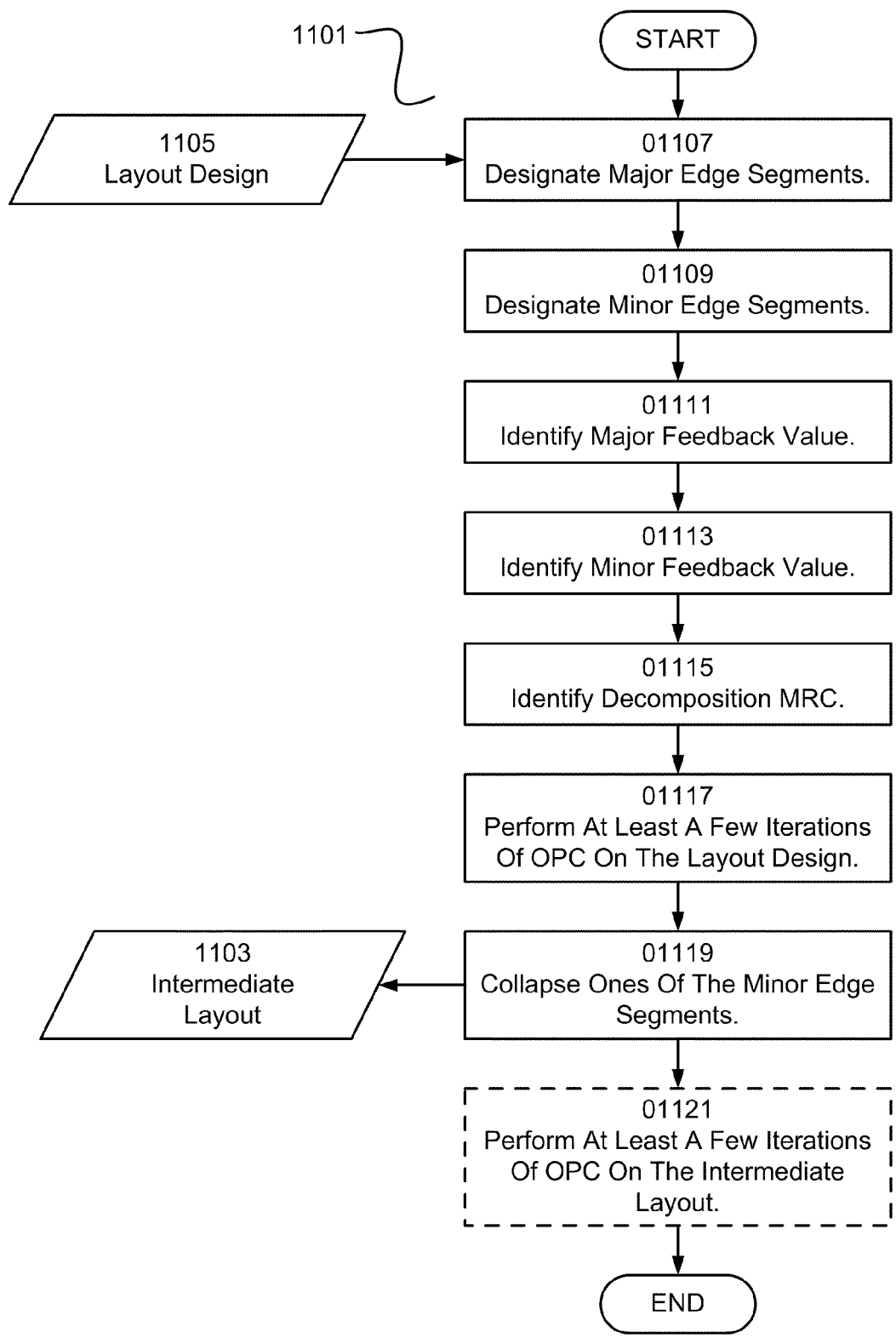
FIG. 11 illustrates a method of generating an intermediate layout design.
Figure 12B:
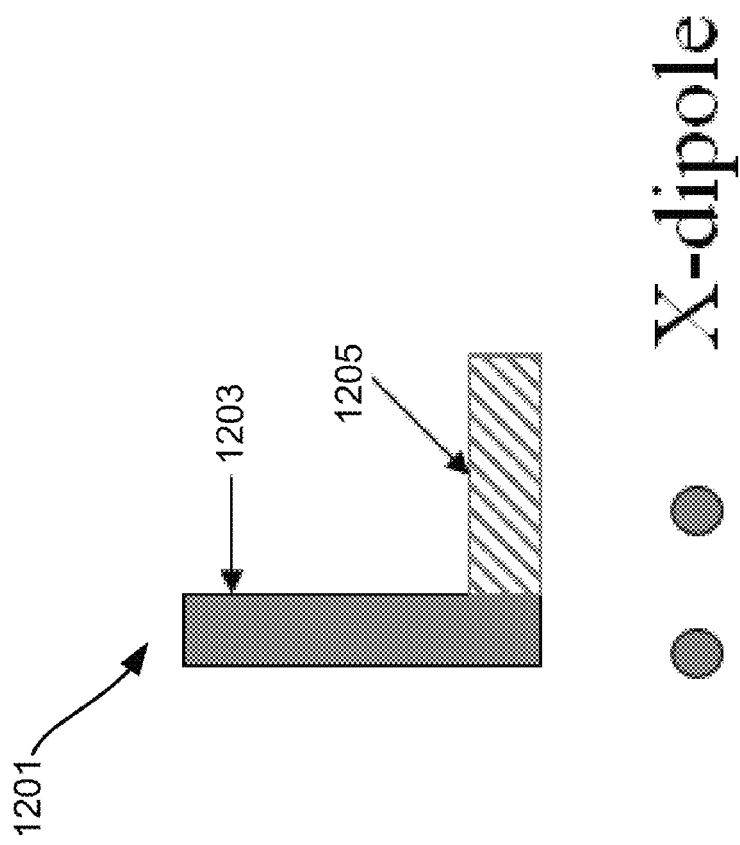
FIG. 12B illustrates the layout feature of FIG. 12A, highlighting major and minor edges for an x-dipole layout.
Figure 12A:
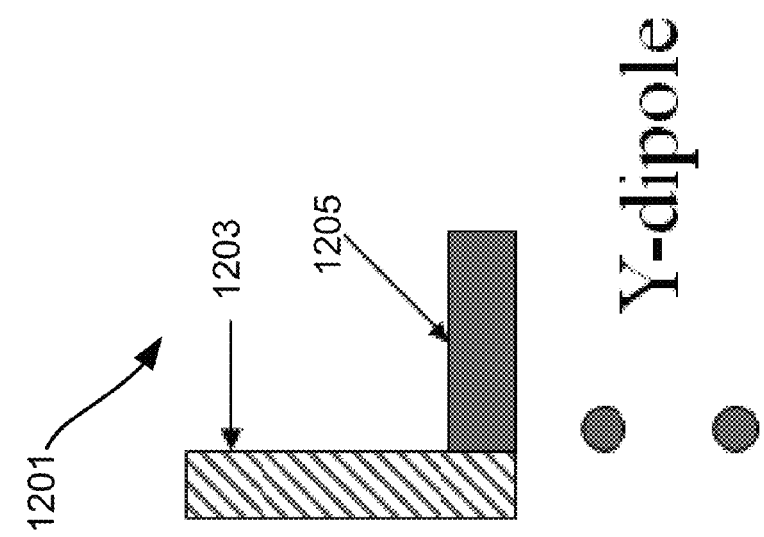
FIG. 12A illustrates a layout feature, highlighting major and minor edges for a y-dipole layout.

FIG. 11 illustrates a method 1101 for generating an intermediate layout design 1103 from a layout design 1105. In various implementations of the invention either of the operation 1009 or 1013 may generate an intermediate layout design according to the method 1101. As can be seen from this figure, the method 1101 includes an operation 1107 and an operation 1109 for designating major edge segments and minor edge segments respectively. In various implementations of the invention, the operations 1107 and 1109 designate edge segments based upon whether the intermediate layer is a x-dipole layer or a y-dipole layer. For example, FIG. 12A illustrates a target shape 1201, having a first edge 1203 and a second edge 1205. This figure additionally shows a vertical or y-dipole. Accordingly, if the intermediate layout 1103 were being generated for a y-dipole, the operations 1107 and 1109 may designate the second edge 1205 as the major edge and the first edge 1203 as the minor edge. Conversely, FIG. 12B illustrates the target shape 1201 along with the first edge 1203 and the second edge 1205. However, an x-dipole is shown in FIG. 12B. As such, for an intermediate layout 1103 corresponding to an x-dipole, the operations 1107 and 1109 may designate the first edge 1203 as the major edge and the second edge 1205 as the minor edge.

Returning to FIG. 11, the method 1101 further includes an operation 1111 and an operation 1113 for identifying a major feedback value and a minor feedback value respectively. As stated above, OPC processes typically adjust edge segments some factor of the EPE. This factor is referred to herein as a feedback value. In various implementations, the major feedback value and the minor feedback value are the same. In alternative implementations, the major feedback value is less than the minor feedback value. With some implementations, the minor feedback value is between two and ten times larger than the major feedback value.

The method 1101 additionally includes an operation 1115 for identifying a decomposition mask rule constraint ("MRC"). In various implementations, the operation 1115 identifies the normal mask rule constraint applicable to the target layout and sets the decomposition mask rule constraint to half of the identified normal mask rule constraint value. With some implementations, the operation 1115 sets the decomposition mask rule constraint to a value between 0.25 and 0.75 of the identified normal mask rule constraint value.

An operation 1117 is also shown in FIG. 11. As can be seen, the operation 1117 performs at least a few iterations of OPC on the layout design. With various implementations, the OPC process carried out by the operation 1117 adjusts each edge segment in part based upon the type of edge segment. For example, a major edge segment and a minor edge segment having the same EPE may get different adjustments as the major feedback value and the minor feedback value may be different. Furthermore, as described above, the mask rule constraint value may be adjusted to less than the normal mask rule constraint. As a result, an edge segment may receive an adjustment that move the edge segment closer to another edge segment that would be allowed in a conventional OPC process.

Figure 13B:
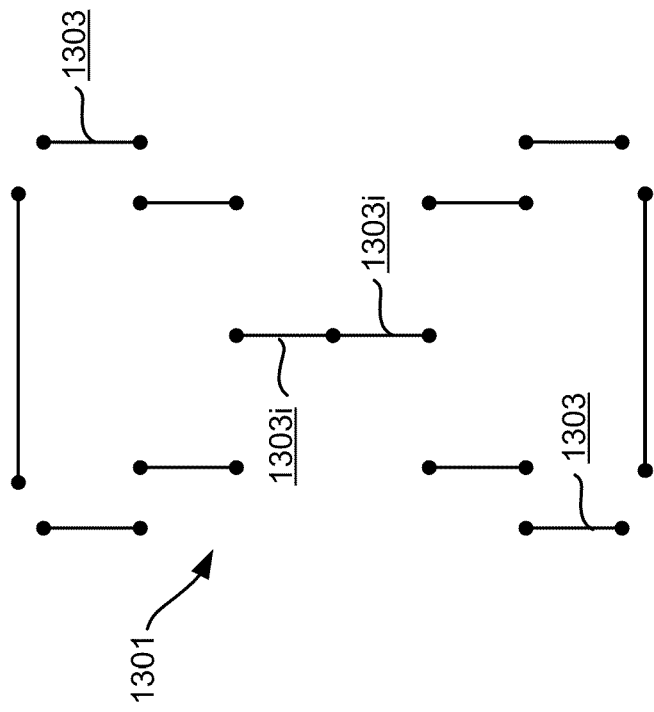
FIG. 13B illustrates the layout design of FIG. 13A, having ones of the edge segments collapsed.
Figure 13A:
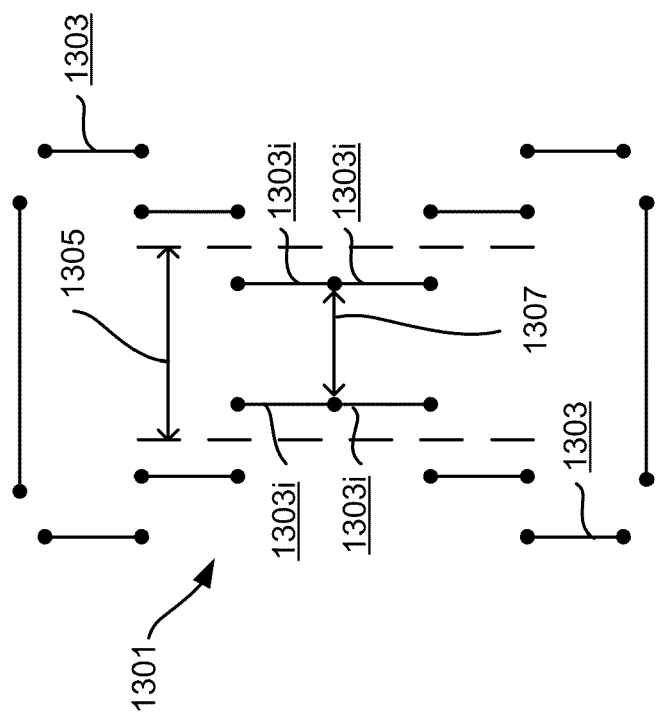
FIG. 13A illustrates a layout design having edge segments.

The method 1101 further includes an operation 1119 for collapsing ones of the minor edge segments. In various implementations, the ones of the minor edge segments separated by a distance of less than the normal mask rule constraint are collapsed. More particularly, these ones of the minor edge segments are, effectively, removed from the layout design. For example, FIG. 13A illustrates a layout design 1301, having edge segments 1303. As can be seen from this figure, the edge segments 1303 have been adjusted, such as in an OPC process for example. FIG. 13A further illustrates a mask rule constraint 1305. As illustrated, the edge segments 1303i are separated by a distance 1307 of less than the mask rule constraint 1305. Accordingly, the operation 1119 would collapse the edge segments 1303i "into each other," resulting in the intermediate layout 1301' shown in FIG. 13B.

The method 1101 additionally includes an optional operation 1121 for performing a few iterations of an OPC process on the intermediate layout 1103. In various implementations, the operation 1121 may perform a set number of implementations of OPC on the intermediate layout 1103. With some implementations, the operation 1121 may "finish" the iterations of OPC started by the operation 1117. More particularly, the operation 1121 may complete either a predetermined number of iterations or may simulate until the EPE corresponding to either or both of the major and minor edge segments is less than a predetermined value.

Forming x-Dipole and y-Dipole Layouts from the Intermediate Layouts

Figure 14:
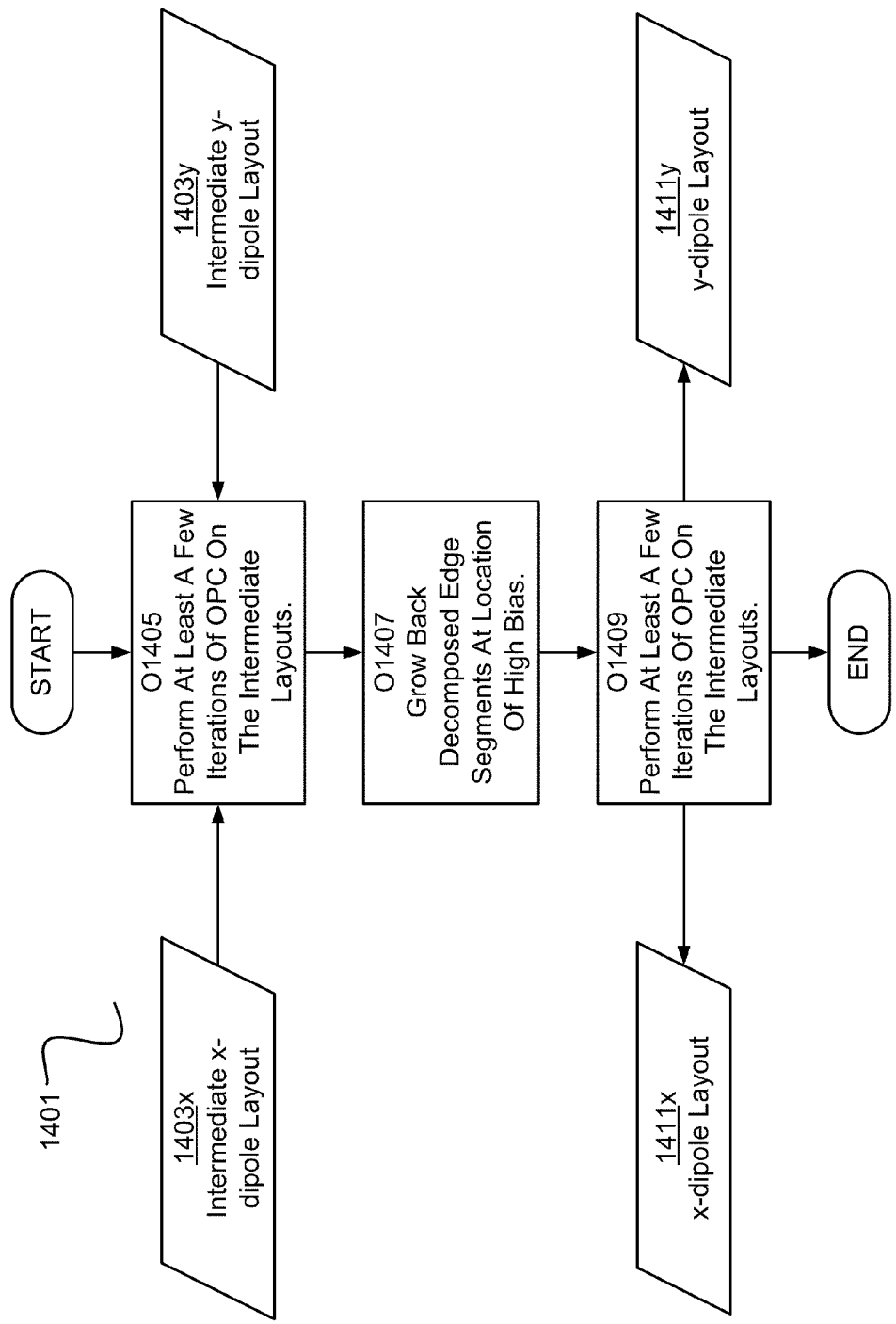
FIG. 14 illustrates a method of performing optical proximity correction on intermediate layout designs.

Returning to FIG. 10, the method 1001 includes the operation 1013 for generating the x-dipole and the y-dipole layouts 1005 and 1007 respectively by performing OPC on the intermediate layout designs. FIG. 14 illustrates a method 1401 for performing OPC on intermediate layout designs 1403. In various implementations, the operation 1013 performs the method 1401. As can be seen from FIG. 14, the method 1401 includes an operation 1405 for performing at least a few iterations of OPC on the intermediate layout designs 1403. As shown, an x-dipole intermediate layout design 1403x and a y-dipole intermediate design 1403y are represented. In various implementations, the operation 1405 performs OPC on the intermediate layouts in conjunction with each other. More particularly, the simulated printed image is generated based upon a simulation of a double dipole lithographic process employing both intermediate layouts 1403.

The method 1401 additionally includes an operation 1407 for growing back selected ones of the decomposed edge segments within the intermediate layout designs 1403 and an operation 1409 for performing at least a few iterations of OPC on the intermediate layouts 1403, resulting in the dipole layouts 1411. In various implementations, decomposed edge segments having an EPE, or "bias" larger than preselected value may be "grown" back. With some implementations, decomposed edge segments within a particular distance from a decomposed edge segments having a bias larger than a preselected bias may be grown back. Still, with various implementations, decomposed edge segments within a particular distance from any edge segments having a bias larger than a preselected bias may be grown back.

Figure 15:
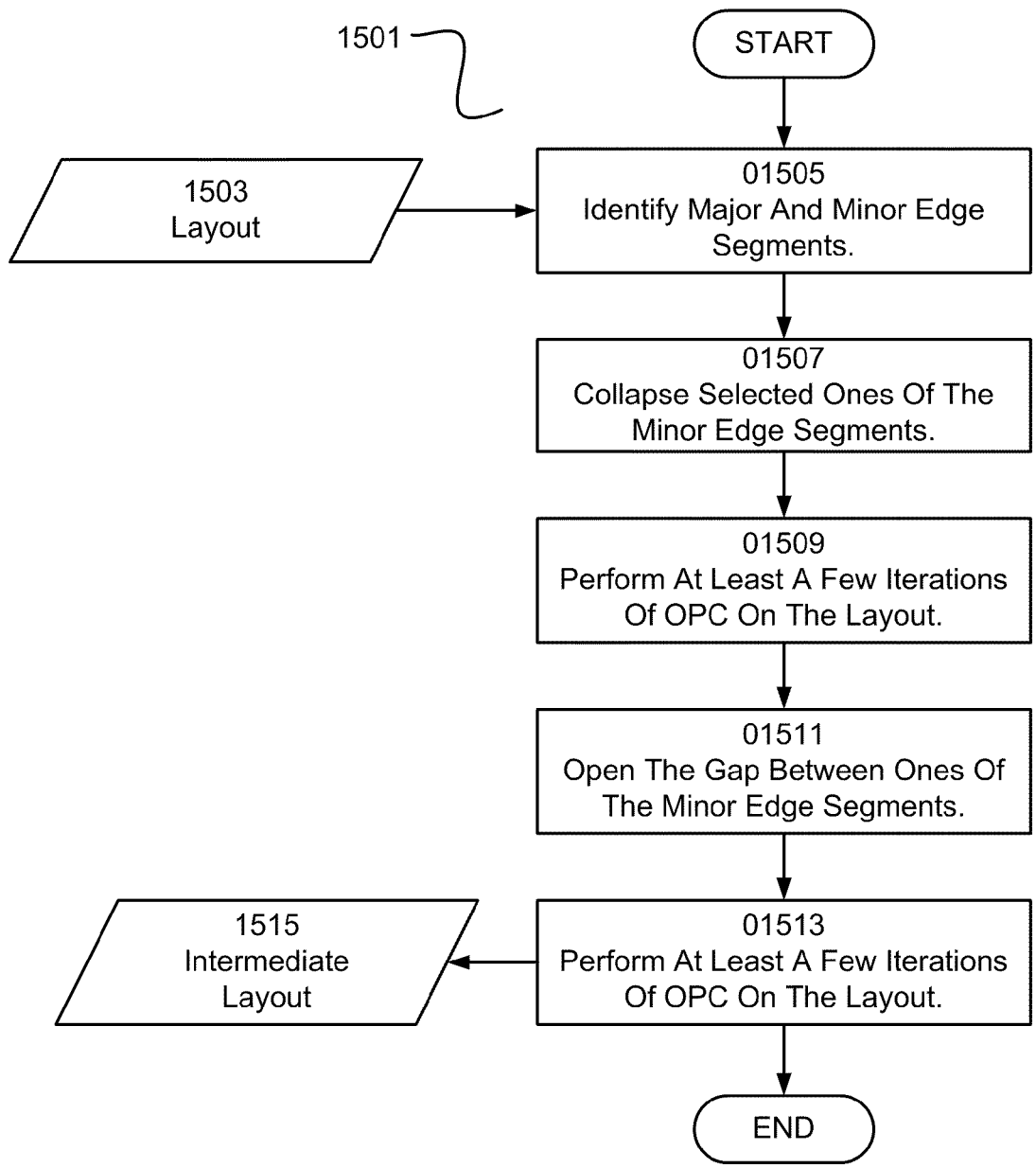
FIG. 15 illustrates a method of growing back collapsed edge segments.

FIG. 15 illustrates a method 1501 for growing back decomposed edge segments within a layout 1503, which may in some implementations, be performed by the operation 1407 of the method 1401. As can be seen from this figure, the method 1501 includes an operation 1505 for identifying major edge segments and minor edge segments within the layout 1503. As detailed earlier in conjunction with FIG. 11 and FIGS. 12A and 12B, the major edge segments may be ones that are orthogonal to the layouts dipoles. For example, for a y-dipole layout, the major edge segments are the horizontal edge segments while the minor edge segments are the vertical edge segments.

The method 1501 further includes an operation 1507 for collapsing ones of the minor edge segments within the layout 1503. In various implementations, all of the minor edge segments within the layout 1503 are collapsed. With some implementations, ones of the minor edge segments having an EPE higher than a preselected EPE are collapsed. Still, with some implementations, ones of the minor edge segments having an EPE less than a preselected EPE are collapsed. Subsequently, the method 1501 includes an operation 1509 for performing at least a few iterations of OPC on the layout design 1503, an operation 1511 for spreading ones of the collapsed edge segments in the layout 1503 out from each other, and an operation 1513 for performing at least a few iterations of OPC on the layout design, resulting in an intermediate layout 1515.

In various implementations, the operation 1511 for spreading ones of the collapsed edge segments in the layout 1503 out from each other. In various implementations, the operation 1511 opens the "gap" between corresponding edge segments such that the edge segments are aligned with the target image.

With various implementations, the operation 1511 opens the gap between corresponding edge segments such that the edge segments are aligned with the corresponding edge segments on the opposite dipole layout (i.e. which are major edge segments in that layout.) Still, in various implementations, the operation 1511 opens the gap between corresponding edge segments a preselected value based upon the type of edge segment (i.e. line end, straight, corner, etc.). Further still, in various implementations, the operation 1511 opens the gap between corresponding edge segments a preselected distance based in part upon the gap between neighbor edge segments.

With some implementations, the operation 1511 opens the gap between minor edge segments that have an EPE higher than a predetermined value. In some implementations, the operation 1511 opens the gap between selected minor edge segments having a selected proximity to major edge segments. Still, in various implementations, the operation 1511 opens the gap between selected minor edge segments having a selected proximity to certain types of major edge segments.

Mask Decomposition Apparatus

Figure 16:
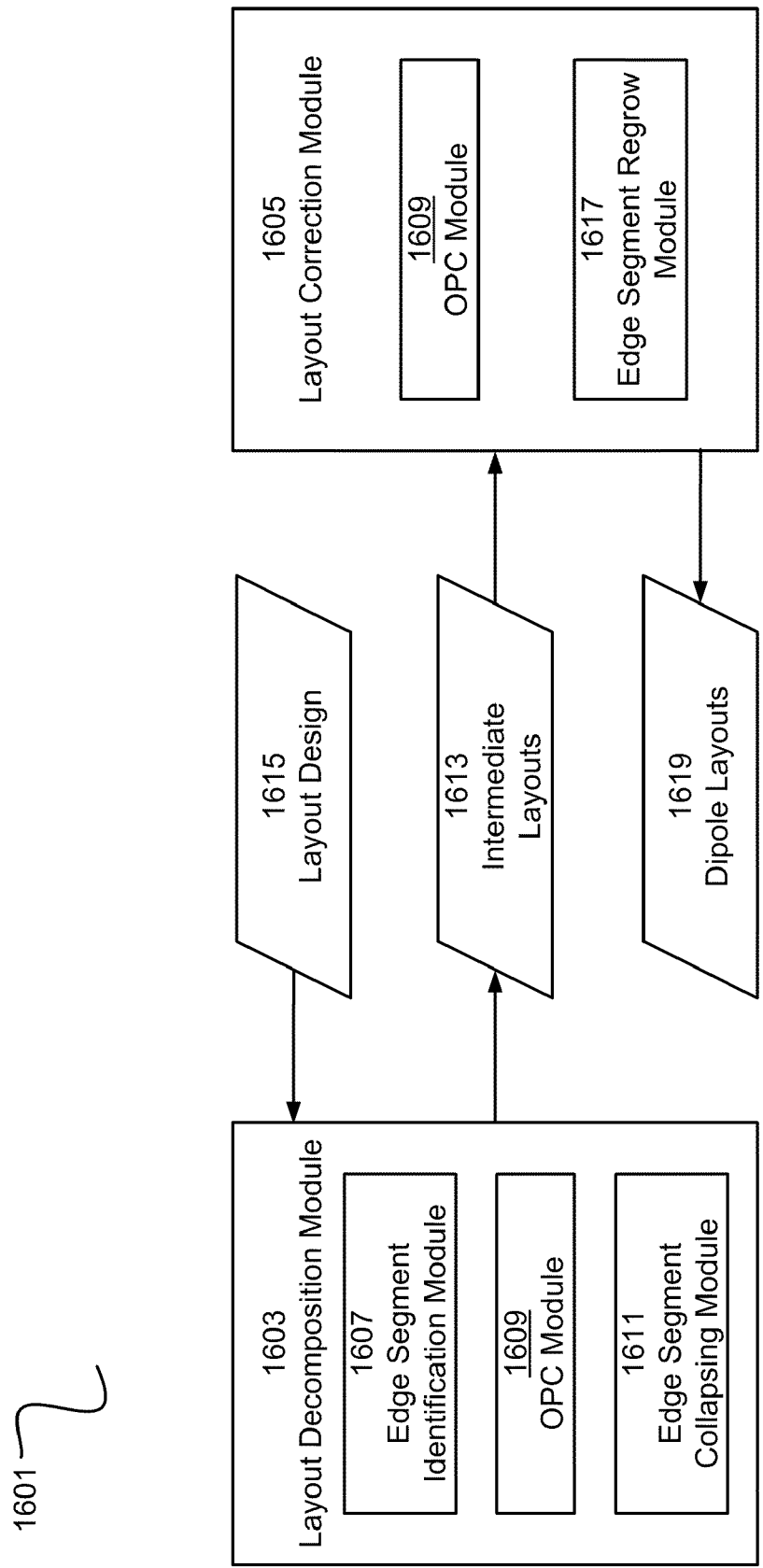
FIG. 16 illustrates a mask decomposition apparatus.

FIG. 16 illustrates a mask decomposition apparatus 1601. As can be seen from this figure, the apparatus 1601 includes a layout decomposition module 1603 and a layout correction module 1605. As can be seen from this figure, the layout decomposition module includes an edge segment identification module 1607, an optical proximity correction module 1609, and an edge segment collapsing module 1611. In various implementations. In various implementations, the layout decomposition module 1603 may be employed to generate intermediate layouts 1613 from a layout design 1615. For example, the layout decomposition module 1603 may be configured to implement the method 1001 of FIG. 10. Alternatively or additionally, the layout decomposition module 1603 may be configured to implement the method 1101 of FIG. 11.

The layout correction module 1607 includes the optical proximity correction module 1609 and an edge segment regrow module 1617. In various implementations, the edge segment regrow module is configured to implement the method 1501 of FIG. 15. As illustrated, the layout correction module 1605 may generate dipole layouts, such as x-dipole and y-dipole layouts for example, from the intermediate layouts 1613.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer-implemented method for generating a pair of layouts, which may be used to form a pair of double dipole lithographic masks, the method comprising:
    generating an intermediate y-dipole layout by decomposing a target layout, wherein the target layout includes a plurality of polygon edges that have been partitioned into a plurality of edge segments and wherein the intermediate v-dipole layout generation includes:
        designating ones of the plurality of edge segments having a first orientation as minor edges;
        designating ones of the plurality of edge segments having an orientation perpendicular to the first orientation as major edges;
        adjusting on the computer the target layout by implementing a few iterations of an optical proximity correction process on the target layout, wherein the mask rule constraint of the optical proximity correction process corresponds to a v-dipole decomposition mask rule constraint, the adjustments to the major edge segments are derived based in part upon a major v-dipole feedback value, and the adjustments to the minor edge segments are derived based in part upon a minor v-dipole feedback value; and
        collapsing ones of the minor edge segments separated by a distance of less than a target mask rule constraint;
    generating an intermediate x-dipole layout by decomposing the target layout; and
    generating a y-dipole layout and an x-dipole layout by implementing an optical proximity correction process on the intermediate y-dipole layout and the intermediate x-dipole layout.

2. The computer-implemented method recited in claim 1, the method act for generating an intermediate x-dipole layout by decomposing the target layout comprising:
    designating ones of the plurality of edge segments having the first orientation as major edges;
    designating ones of the plurality of edge segments having an orientation perpendicular to the first orientation as minor edges;
    adjusting the target layout by implementing a few iterations of the optical proximity correction process on the target layout, wherein: the mask rule constraint of the optical proximity correction process corresponds to a x-dipole decomposition mask rule constraint, the adjustments to the major edge segments are derived based in part upon a major x-dipole feedback values the adjustments to the minor edge segments are derived based in part upon a minor x-dipole feedback value;
    identifying a target mask rule constraint; and
    collapsing ones of the minor edge segments separated by a distance of less than the target mask rule constraint.

3. The computer-implemented method recited in claim 2, the method act for generating a y-dipole layout and an x-dipole layout by implementing an optical proximity correction process on the intermediate y-dipole layout and the intermediate x-dipole layout comprising growing back ones of the collapsed minor edge segments.

4. The computer-implemented method recited in claim 3, the method act for growing back ones of the collapsed minor edge segments comprising:
    performing at least a few iterations of optical proximity correction on the layout containing the collapsed minor edge segments, wherein ones of the edge segments are expanded outward from their collapsed position during the optical proximity correction process.

5. The computer-implemented method recited in claim 3, wherein the selected ones of the major edge segments are line end edge segments.

6. The computer-implemented method recited in claim 3, wherein the selected ones of the major edge segments are corner edge segments.

7. The computer-implemented method recited in claim 3, wherein the selected ones of the major edge segments are major edge segments that have an edge placement error larger than a preselected value.

8. The computer-implemented method recited in claim 2, the method act for generating a y-dipole layout and an x-dipole layout by implementing an optical proximity correction process on the intermediate y-dipole layout and the intermediate x-dipole layout comprising expanding ones of the collapsed minor edge, wherein ones of the collapsed minor edge segments are expanded outward from their collapsed position during optical proximity correction.

9. One or more non-transient computer-readable media, having computer executable instructions for generating a pair of layouts, which may be used to form a pair of double dipole lithographic masks, stored thereon, the computer executable instructions comprise:
 causing a computer to perform a set of operations; and
 wherein the set of operations comprise:
  generating an intermediate v-dipole layout by decomposing a target layout, wherein the target layout includes a plurality of polygon edges that have been partitioned into a plurality of edge segments and wherein the intermediate v-dipole layout generation includes:
   designating ones of the plurality of edge segments having a first orientation as minor edges;
   designating ones of the plurality of edge segments having an orientation perpendicular to the first orientation as major edges;
   adjusting on the computer the target layout by implementing a few iterations of an optical proximity correction process on the target layout, wherein the mask rule constraint of the optical proximity correction process corresponds to a v-dipole decomposition mask rule constraint, the adjustments to the major edge segments are derived based in part upon a major v-dipole feedback value, and the adjustments to the minor edge segments are derived based in part upon a minor v-dipole feedback value; and
   collapsing ones of the minor edge segments separated by a distance of less than a target mask rule constraint;
  generating an intermediate x-dipole layout by decomposing the target layout; and
  generating a y-dipole layout and an x-dipole layout by implementing an optical proximity correction process on the intermediate y-dipole layout and the intermediate x-dipole layout.

10. The one or more non-transient computer-readable media recited in claim 9, the operations for generating an intermediate x-dipole layout by decomposing the target layout comprising:
 designating ones of the plurality of edge segments having the first orientation as major edges;
 designating ones of the plurality of edge segments having an orientation perpendicular to the first orientation as minor edges;
 identifying a major x-dipole feedback value;
 identifying a minor x-dipole feedback value;
 identifying a x-dipole decomposition mask rule constraint;
 implementing a few iterations of the optical proximity correction process on the target layout, wherein:
  the mask rule constraint of the optical proximity correction process corresponds to the x-dipole decomposition mask rule constraint;
  the adjustments to the major edge segments are derived based in part upon the major x-dipole feedback value;
  the adjustments to the minor edge segments are derived based in part upon the minor x-dipole feedback value; and
  the target layout is adjusted by the optical proximity correction process;
 identifying a target mask rule constraint; and
 collapsing ones of the minor edge segments separated by a distance of less than the target mask rule constraint.

11. The one or more non-transient computer-readable media recited in claim 10, the operation for generating a y-dipole layout and an x-dipole layout by implementing an optical proximity correction process on the intermediate y-dipole layout and the intermediate x-dipole layout comprising growing back ones of the collapsed minor edge segments.

12. The one or more non-transient computer-readable media recited in claim 11, the operation for growing back ones of the collapsed minor edge segments comprising:
 performing at least a few iterations of an optical proximity correction process on the layout containing the collapsed minor edge segments,
 wherein ones of the edge segments are expanded out from their collapsed position during the optical proximity correction process.

13. The one or more non-transient computer-readable media recited in claim 11, wherein the selected ones of the major edge segments are line end edge segments.

14. The one or more non-transient tangible computer-readable media recited in claim 11, wherein the selected ones of the major edge segments are corner edge segments.

15. The one or more non-transient computer-readable media recited in claim 11, wherein the selected ones of the major edge segments are major edge segments that have an edge placement error larger than a preselected value.

16. The one or more non-transient computer-readable media recited in claim 10, wherein the horizontal decomposition mask rule constraint equals half the target mask rule constraint.

17. The one or more non-transient computer-readable media recited in claim 10, wherein the vertical decomposition mask rule constraint equals half the target mask rule constraint.

18. The one or more non-transient computer-readable media recited in claim 10, the operation for generating a y-dipole layout and an x-dipole layout by implementing an optical proximity correction process on the intermediate y-dipole layout and the intermediate x-dipole layout comprising expanding ones of the collapsed minor edge segments outward from their collapsed position.

* * * * *